United States Patent [19]
Mohan

[11] Patent Number: 5,414,346
[45] Date of Patent: May 9, 1995

[54] ADJUSTABLE PIERCING PROBE TIP

[75] Inventor: Philip V. Mohan, Troy, Mich.

[73] Assignee: Chrysler Corporation, Highland Park, Mich.

[21] Appl. No.: 158,133

[22] Filed: Nov. 24, 1993

[51] Int. Cl.⁶ .......................................... G01R 31/02
[52] U.S. Cl. .................... 324/72.5; 324/754; 324/761; 439/416
[58] Field of Search ............... 324/72.5, 158 P, 754, 324/761; 173/273; 439/416

[56] References Cited
U.S. PATENT DOCUMENTS

| 467,891 | 1/1892 | Neu | 324/72.5 |
| 2,196,964 | 4/1940 | Lee | 173/273 |
| 2,529,270 | 11/1950 | Webster | 324/72.5 |
| 5,041,781 | 8/1991 | Kawada | 324/72.5 |
| 5,105,148 | 4/1992 | Lee | 324/158 P |

Primary Examiner—Kenneth A. Wieder
Assistant Examiner—Mark Wardas
Attorney, Agent, or Firm—Wendell K. Fredericks

[57] ABSTRACT

An adjustable probe tip has a female part that includes a ring structure and a hook extending therefrom. The ring structure has a threaded bore. The probe tip also has a male part having a threaded cylindrical surface that is screwably received by the female part. The male part has an inner bore that is not threaded and receives a metal probe tip cap therein. Screwing the male part into the threaded bore of the female part adjusts the relative distance between the hook and the end of the male part. The metal cap is received in the end so that a wire trapped between the metal part and the hook may be pierced by a probe tip of the metal cap. A test probe may be received by the male cap and bore of the male part so that electrical contact will be made between the probe tip and the metal cap. As the probe pierces the wire trapped between the probe tip cap and the hook, a secure contact is made between the conductive core of the wire and the conductive path from the probe tip to the test equipment.

10 Claims, 2 Drawing Sheets

ADJUSTABLE PIERCING PROBE TIP

FIELD OF THE INVENTION

The present invention relates to a piercing probe tip for an oscilloscope probe and more particularly to a piercing probe tip that can be adjusted for a variety of diameters of wires to be tested.

BACKGROUND OF THE INVENTION

Probes are used as test leads for oscilloscopes and meters. Electronic measuring equipment—oscilloscopes and meters—can be very exact. But however exact the test equipment, it proves to be of little use if a proper connection with a circuit to be tested is not made.

A conventional test probe is shown in FIG. 1. The probe 10 has a test tip 12 extending from a head 14. A leakage barrier 16 divides the head 14 from the handle 18. A cable 20 extends from the handle 16 to a banana plug 22, which plugs into the test equipment (not shown).

A variety of connecting devices are available to secure a variety of test connections. Such connections include test clips, piercing clips, and piercing grabbers. Most of these devices grab a wire of the circuit to be tested to hold the wire in a set relationship with the probe which is used to pierce the insulation surrounding the wire. Thus, if the wire is jostled, the probe tip is not loosened for a bad connection. Known accessories are limited, however, to structures sized for particular wires or with limited adjustability, usually at the sacrifice of a sturdy hold on the wire.

SUMMARY OF THE INVENTION

It is a principal object of the present invention to provide an accessory that is capable of a sturdy hold on a wire without regard to the diameter of the wire, the accessory being adjustable to the diameter of the wire.

This and other objects of the invention are accomplished in an adjustable, hook-styled test clip that embodies the invention. The test clip includes a hook portion that extends from a threaded ring portion. The threaded ring portion provides a threadable female inner surface that mates with a threaded male part. A threaded screw portion of the male part extends from a ring abutment adapted to abut the threaded ring of the female part. The male portion and the abutment have a common bore communicating through them. The bore is adapted to receive a probe having a piercing tip. The probe, when inserted into the bore, may be locked therein. The bore may be shaped to intimately accommodate a portion of the probe. A cap shaped to accommodate the portion of the probe to be inserted into the bore is fixedly mounted in the bore, either at its front end facing the hook or substantially throughout the bore. The cap has a hollow cap tip to receive the probe tip, or a hole is provided through which the piercing tip of the probe may be inserted to extend toward the hook, or the hook and ring, female part may be screwed onto the male portion to allow the hook to be drawn closer to the male part and thereby the probe tip. Accordingly, when a wire is inserted between the probe tip and the hook, the male portion may be screwed into the female portion to cause the probe tip to pierce the insulating cover of the wire and make contact with its conductive center. The hook holds the wire in contact with the conductive center with a sturdy grip that may be relieved by unscrewing the male part from the female ring portion.

Other embodiments of the piercing probe tip include different caps for the head of the piercing probe.

DETAILED DESCRIPTION OF THE PREFERRED EMBODIMENTS

Figure 2:
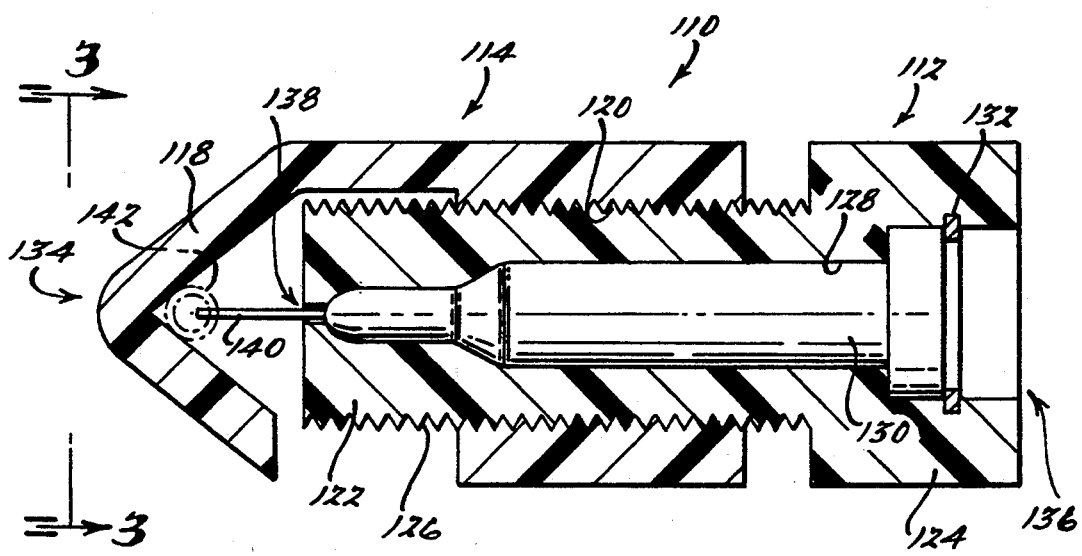
FIG. 2 is a longitudinal cross-section of the safety grip in accordance with a first embodiment of the present invention.
Figure 3:
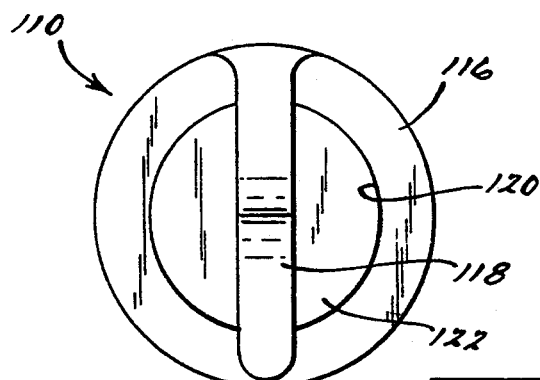
FIG. 3 is a view of the hook taken in the direction 3—3 of FIG. 2.

Referring first to both FIGS. 2 and 3, an adjustable piercing probe tip safety grip 110 in accordance with the present invention comprises a male part 112 and a female part 114. The female part 114 includes a ring portion 116 and a hook portion 118. The hook portion 118 extends from the ring portion 116. The ring portion 116 has a threaded bore 120.

The male part 112 has an end portion 124 and a screw portion 122. The screw portion 122 has a threaded outer surface 126, which threads cooperatively into the bore 120 of the female part 114.

Figure 1:
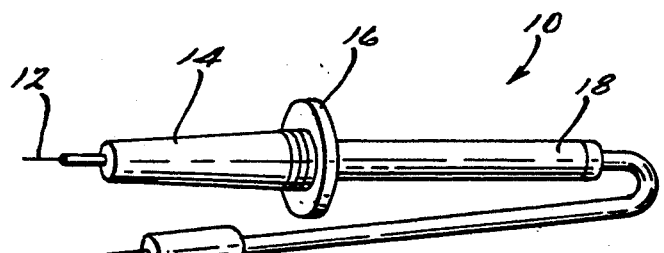
FIG. 1 is a representative drawing of a conventional probe.

The male part 112 also has an inner bore 128 that is not threaded. The inner bore 128 is adapted to receive the head of a probe, for example, head 14 of probe 10 shown in FIG. 1. More specifically, the inner bore 128 is adapted to receive a probe cap 130, which receives the head of the probe, again the example of head 14 of probe 10 shown in FIG. 1. The probe cap 130 is locked into inner bore 128 by a lock ring 132.

The adjustable piercing probe tip 110 is designated as having a front end 134 and a rear end 136, and all other elements are so oriented. Towards the front end of the male part 112, in particular, the screw portion 122 thereof, there is an opening 138 that is large enough to allow a cap probe tip 140 to extend therethrough. The cap probe tip 140 is not the probe tip 12 of the probe itself, but rather is an extension from the probe cap 130.

Thus, when a wire, for example, wire 142 shown in phantom is trapped between the hook 118 and the cap probe tip 140, and the end portion 124 of the male part 112 is used to screw the screw portion 122 into the female part 114, the cap probe tip 140 is forced into the insulation surrounding the wire to pierce the insulation and make contact with the conductive core of the wire 142. The contact is sturdy and will hold forth until the male part 112 is screwed out again. The head of a probe, for example, probe 10 of FIG. 1, may be pushed into the probe cap 130, so that the actual probe tip is in conductive contact with the wire core.

The materials out of which the safety grip 110 is made are important to the success of the invention. Thus, the male part 112 and the female part 114 of the adjustable piercing probe tip 110 are made of a nonconductive material, such as plastic. Thus, the inner bore 128 may be conveniently formed as the male part 112 is molded. The probe cap 130, however, is made of a conductive material. It is open to receive the probe head. The probe cap tip 140, may be formed as a hollow needle so that the probe tip 12 may be inserted therein, or the probe cap 130 may have an opening at its end to allow the probe tip 12 to be inserted therethrough. In the latter option, it is the probe tip itself that cooperates with the hook 118 to trap the wire therebetween.

Figure 4:
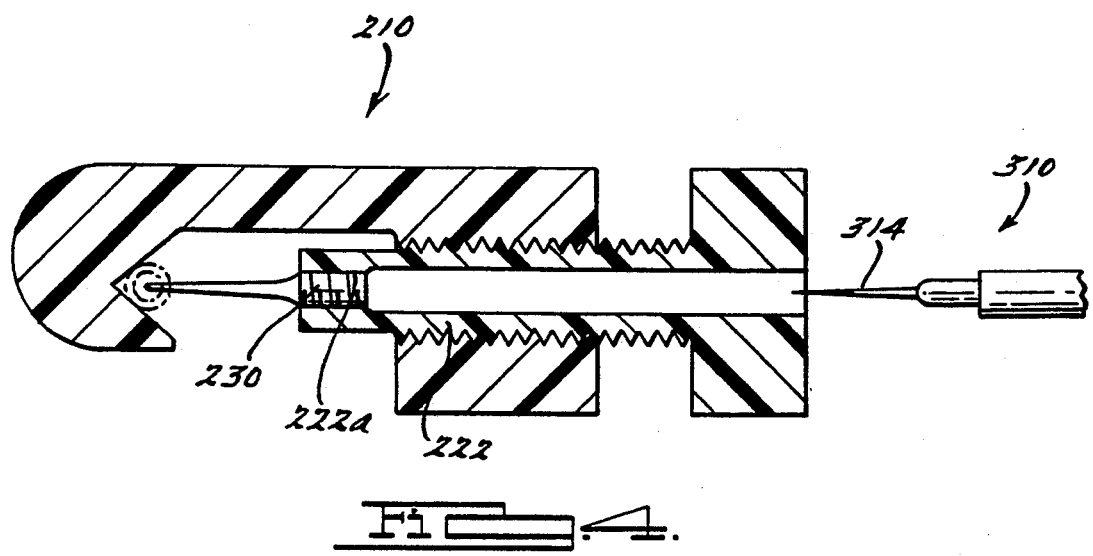
FIG. 4 is a longitudinal cross-section of a second embodiment of the invention.

Referring now to FIG. 4, a second embodiment of the adjustable piercing probe tip 210 is shown to have a structure like that of the first embodiment, except that the end of the male part 222a has a probe tip cap 230 adapted to receive only a portion of the probe head 314 of the probe 310. The probe cap 230 is threadably received in the end portion 222a of the screw portion 222. Before the cap 230 is screwed into the threaded end portion 222a of 222, an adhesive is placed on both the cap 230 and the threaded end portion 222a, so that the cap 230 is bonded to the end portion 222a of the screw 222.

Again, the adjustable piercing probe tip 210 is made of a nonconductive material. The cap 230, however, is made of a metal, or conductive material.

Figure 5:
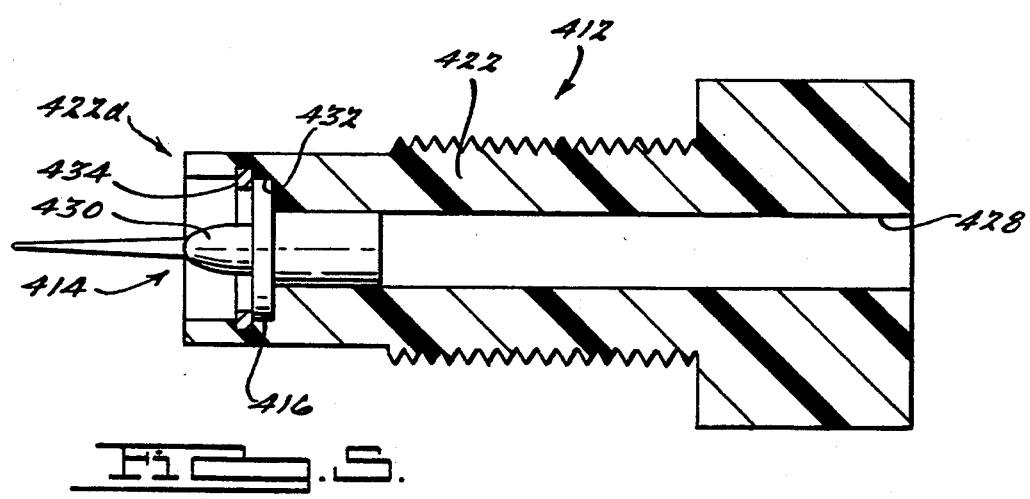
FIG. 5 is a longitudinal cross-section of the male part of a third embodiment shown in FIG. 4.
Figure 6:
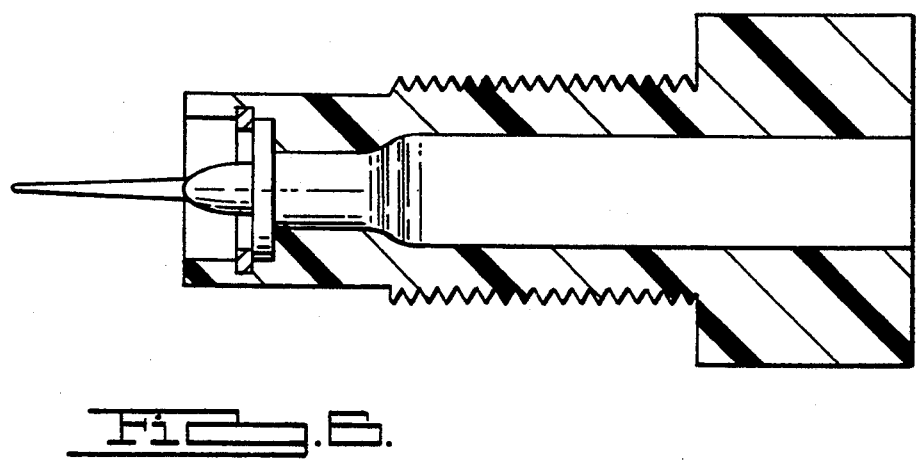
FIG. 6 is a longitudinal cross-section of a fourth embodiment of the present invention.

In the embodiment shown in FIG. 5, only the male part 412 is illustrated, as the female part is the same as in the other embodiments. The male part 412 has an open tip 414. The opening 414 accomodates a cap 430 which has a circular flange 416 that abuts the screw wall at the end of bore 428 before it opens to a wider bore 432 to accommodate the flange 416. A lock ring 434 traps the flange in the wider bore 413, thereby trapping the cap 430 within the screw tip 422a. As can be seen in FIG. 6, the structure of the embodiment shown in FIG. 5 may be used with a full cap to cover the head of the probe.

The embodiments shown in FIGS. 5 and 6 have the advantage of being able to be pulled from the tip so as to provide for other caps to be inserted.

It is thus seen that the present invention provides for a quick way of plugging in a probe tip into a safety grip that is both sturdy and adaptable to various size wires. The embodiment shown in the figures are but an example of the general principal of the present invention which is set forth in the claims that follow.

I claim:

1. An adjustable safety grip having a front end and a rear end, said grip for gripping wires of a variety of diameters for a test probe, said grip comprising:
   a female part having a ring portion, the ring portion including a threaded bore extending from a front bore end to a rear bore end, the female part having a hook portion hooking over the front end of the said bore; and
   a male part,
   means for moving said male part closer to said female part wherein said male part includes a threaded cylindrical outer surface screwably received by said threaded bore to adjustably couple said male part and said female part, said male part extending from a front screw end to a rear screw end, said front screw end opposing said hook, so that when said male part is pivoted and a wire is located between said hook and said front screw end, said wire is secureably trapped between said hook and said front screw end,
   wherein said male part includes an inner bore and a probe cap residing within said inner bore wherein said probe cap includes a needle extending therefrom and through an opening in said male part,
   wherein said needle is hollow to receive a probe tip therein.

2. The grip of claim 1, wherein said male part includes an inner bore adapted to receive the head of a probe.

3. The grip of claim 2, wherein said male part is made from non-conductive material and said probe cap is made from conductive material.

4. The grip of claim 2, wherein said cap is adhesively joined to said inner bore of said male part.

5. The grip of claim 2, wherein said cap is retained within said inner bore of said male part by way of a lock ring.

6. An electronic probe for use with electronic instrument, comprising:
   hook means for attaching said probe to an electrical conductor to be probed,
   probe means for detecting an electric signal present on said conductor,
   means for moving said hook means towards said probe means,
   means for piercing an insulating sheath surrounding said electrical conductor,
   means for detachably coupling said probe to a wire extending between said probe and said electronic instrument,
   wherein said means for detachably coupling includes a male parts wherein said male part includes an inner bore and a probe cap residing within said inner bore,
   wherein said probe cap includes a needle extending therefrom and through an opening in said male part,
   wherein said needle is hollow to receive a probe tip therein.

7. The electronic probe of claim 6, wherein said means for detachably coupling includes a male part, wherein said male part includes an inner bore adapted to receive the head of a probe.

8. The electronic probe of claim 6, wherein said male part is made from non-conductive material and said probe cap is made from conductive material.

9. The electronic probe of claim 6, wherein said cap is adhesively joined to said inner bore of said male part.

10. The electronic probe of claim 6, wherein said cap is retained within said inner bore of said male part by way of a lock ring.

* * * * *